(12) United States Patent
Pilla

(10) Patent No.: US 7,880,309 B2
(45) Date of Patent: Feb. 1, 2011

(54) ARRANGEMENT OF STACKED INTEGRATED CIRCUIT DICE HAVING A DIRECT ELECTRICAL CONNECTION

(75) Inventor: Camillo Pilla, Unterhaching (DE)

(73) Assignee: Qimonda AG, Munich (DE)

( * ) Notice: Subject to any disclaimer, the term of this patent is extended or adjusted under 35 U.S.C. 154(b) by 455 days.

(21) Appl. No.: 11/830,614

(22) Filed: Jul. 30, 2007

(65) Prior Publication Data

US 2009/0032969 A1 Feb. 5, 2009

(51) Int. Cl.
*H01L 23/49* (2006.01)
*H01L 23/52* (2006.01)
*H01L 23/02* (2006.01)
*H01L 23/495* (2006.01)

(52) U.S. Cl. .............. 257/777; 257/E23.024; 257/E21.506; 257/E23.141; 257/E23.01; 257/686; 257/685; 257/723; 257/696; 257/774; 257/773; 257/775; 257/776

(58) Field of Classification Search .......... 257/777, 257/686, 685, 723, E21.506, E23.024, 776, 257/775, 696, 774, 773, E23.141, E23.01; 438/109
See application file for complete search history.

(56) References Cited

U.S. PATENT DOCUMENTS

| | | | |
|---|---|---|---|
| 6,351,028 B1 * | 2/2002 | Akram | 257/686 |
| 6,376,904 B1 | 4/2002 | Haba et al. | |
| 6,407,456 B1 | 6/2002 | Ball | |
| 6,900,528 B2 * | 5/2005 | Mess et al. | 257/686 |
| 6,972,487 B2 | 12/2005 | Kato et al. | |
| 7,009,852 B2 * | 3/2006 | Ying et al. | 363/17 |
| 7,230,330 B2 | 6/2007 | Lee et al. | |
| 7,495,327 B2 * | 2/2009 | Tsai et al. | 257/686 |
| 7,550,834 B2 * | 6/2009 | Yu et al. | 257/686 |
| 7,582,944 B2 * | 9/2009 | Fukuda et al. | 257/432 |
| 7,598,618 B2 * | 10/2009 | Shiraishi | 257/777 |
| 7,800,208 B2 * | 9/2010 | Otremba | 257/678 |
| 2002/0195697 A1 | 12/2002 | Mess et al. | |
| 2004/0015807 A1 | 1/2004 | Honjou et al. | |
| 2004/0245617 A1 | 12/2004 | Damberg et al. | |
| 2005/0116331 A1 | 6/2005 | Tsunozaki | |
| 2005/0153480 A1 * | 7/2005 | Oka | 438/106 |
| 2005/0161792 A1 | 7/2005 | Uchida | |
| 2005/0161814 A1 * | 7/2005 | Mizukoshi et al. | 257/737 |
| 2005/0170600 A1 | 8/2005 | Fukuzo | |
| 2005/0266614 A1 | 12/2005 | Aoyagi | |
| 2006/0091518 A1 * | 5/2006 | Grafe et al. | 257/686 |
| 2006/0113650 A1 * | 6/2006 | Corisis et al. | 257/678 |
| 2006/0138629 A1 * | 6/2006 | Fukazawa | 257/686 |
| 2006/0166404 A1 * | 7/2006 | Corisis et al. | 438/109 |
| 2006/0290005 A1 * | 12/2006 | Thomas et al. | 257/777 |
| 2007/0158807 A1 * | 7/2007 | Lu et al. | 257/686 |

(Continued)

FOREIGN PATENT DOCUMENTS

JP 2005-302815 10/2005

*Primary Examiner*—Alexander O Williams

(57) ABSTRACT

An arrangement of integrated circuit dice, includes first die including a first electrical coupling site and a second die comprising a second electrical coupling site, wherein the second die is stacked onto the first die such that the first electrical coupling site is at least partially exposed, wherein the first electrical coupling site and the second electrical coupling site are directly electrically connected, and a third die arranged above the first die and the second die such that a recess is formed, wherein one of the first electrical coupling sites is arranged in the recess.

12 Claims, 11 Drawing Sheets

U.S. PATENT DOCUMENTS

| | | | |
|---|---|---|---|
| 2007/0210447 A1* | 9/2007 | Kinsley ..................... 257/723 |
| 2007/0222054 A1* | 9/2007 | Hembree ................... 257/686 |
| 2007/0278648 A1* | 12/2007 | Akram ...................... 257/686 |
| 2008/0054489 A1* | 3/2008 | Farrar et al. ................ 257/777 |
| 2008/0083977 A1* | 4/2008 | Haba et al. ................. 257/686 |
| 2008/0237888 A1* | 10/2008 | Hayasaka et al. ........... 257/777 |
| 2008/0303131 A1* | 12/2008 | McElrea et al. ............. 257/686 |
| 2009/0032969 A1* | 2/2009 | Pilla .......................... 257/777 |
| 2009/0096111 A1* | 4/2009 | Fujiwara et al. ............. 257/777 |
| 2009/0108467 A1* | 4/2009 | Otremba ..................... 257/777 |

\* cited by examiner

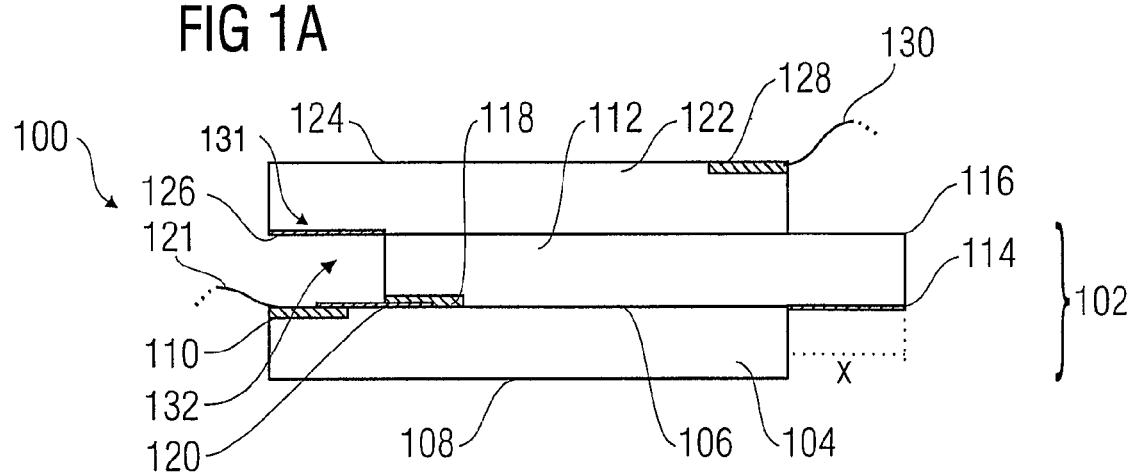
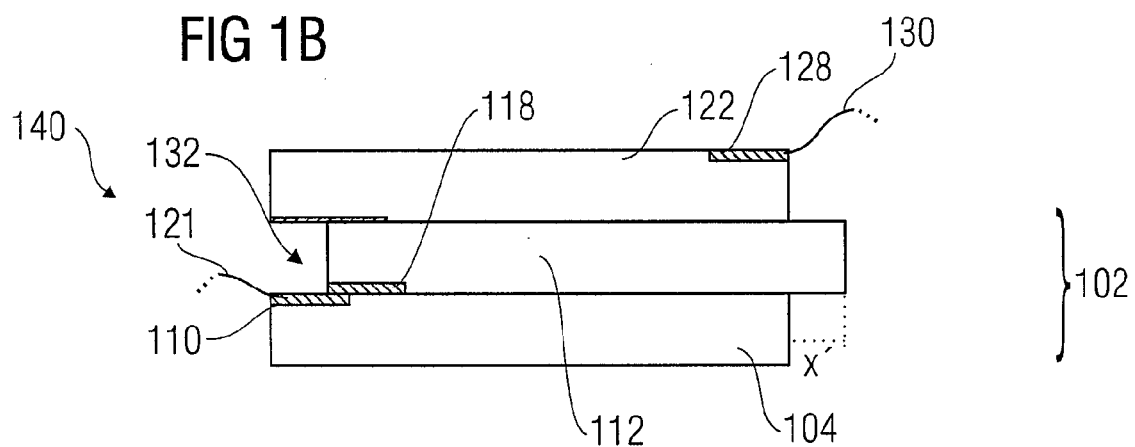
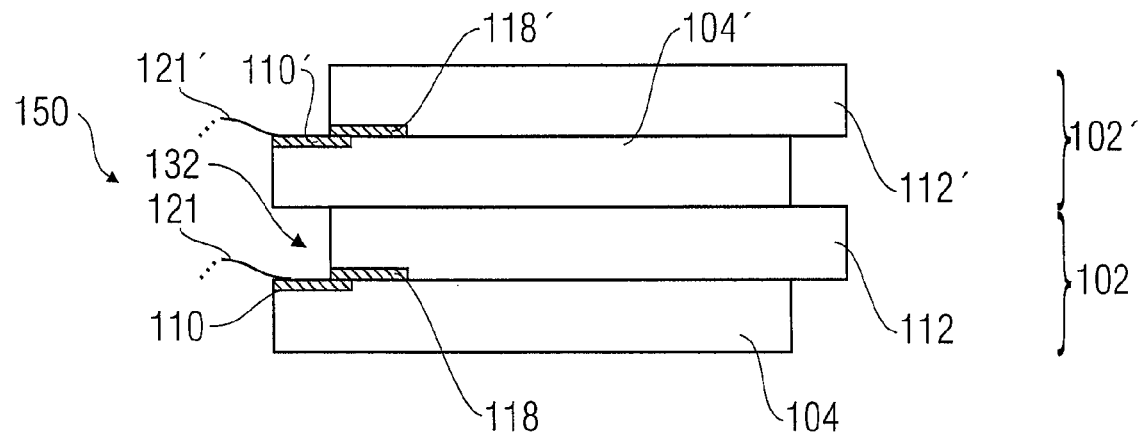

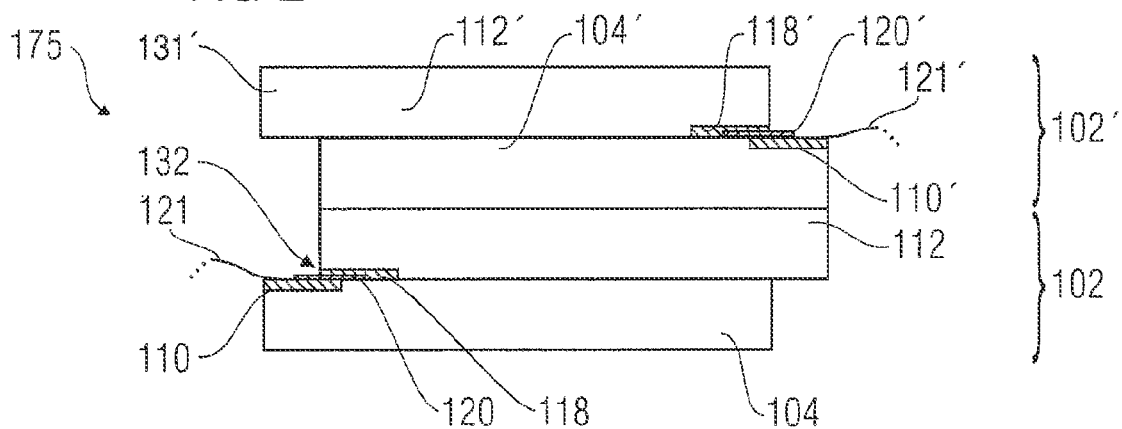
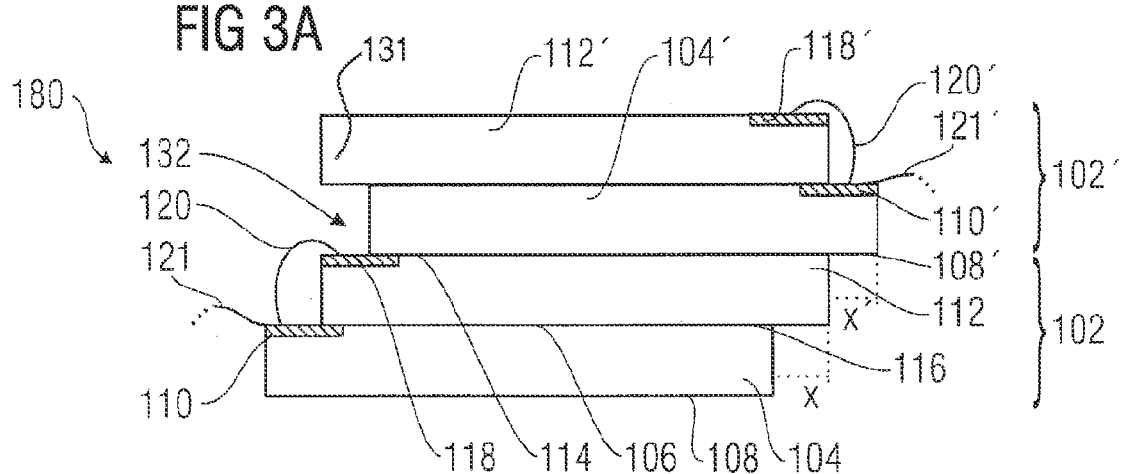
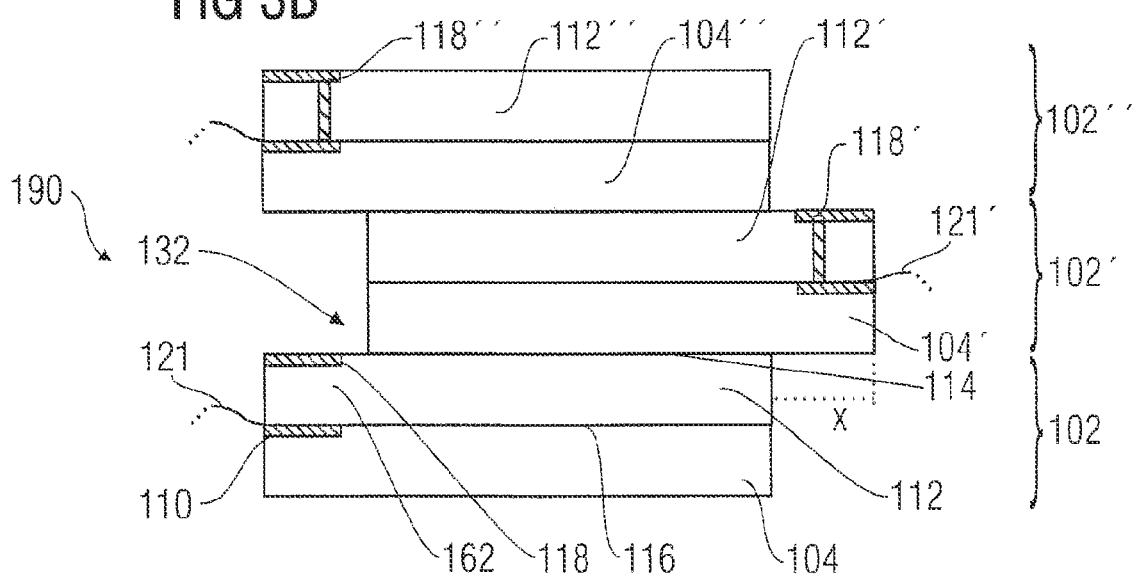

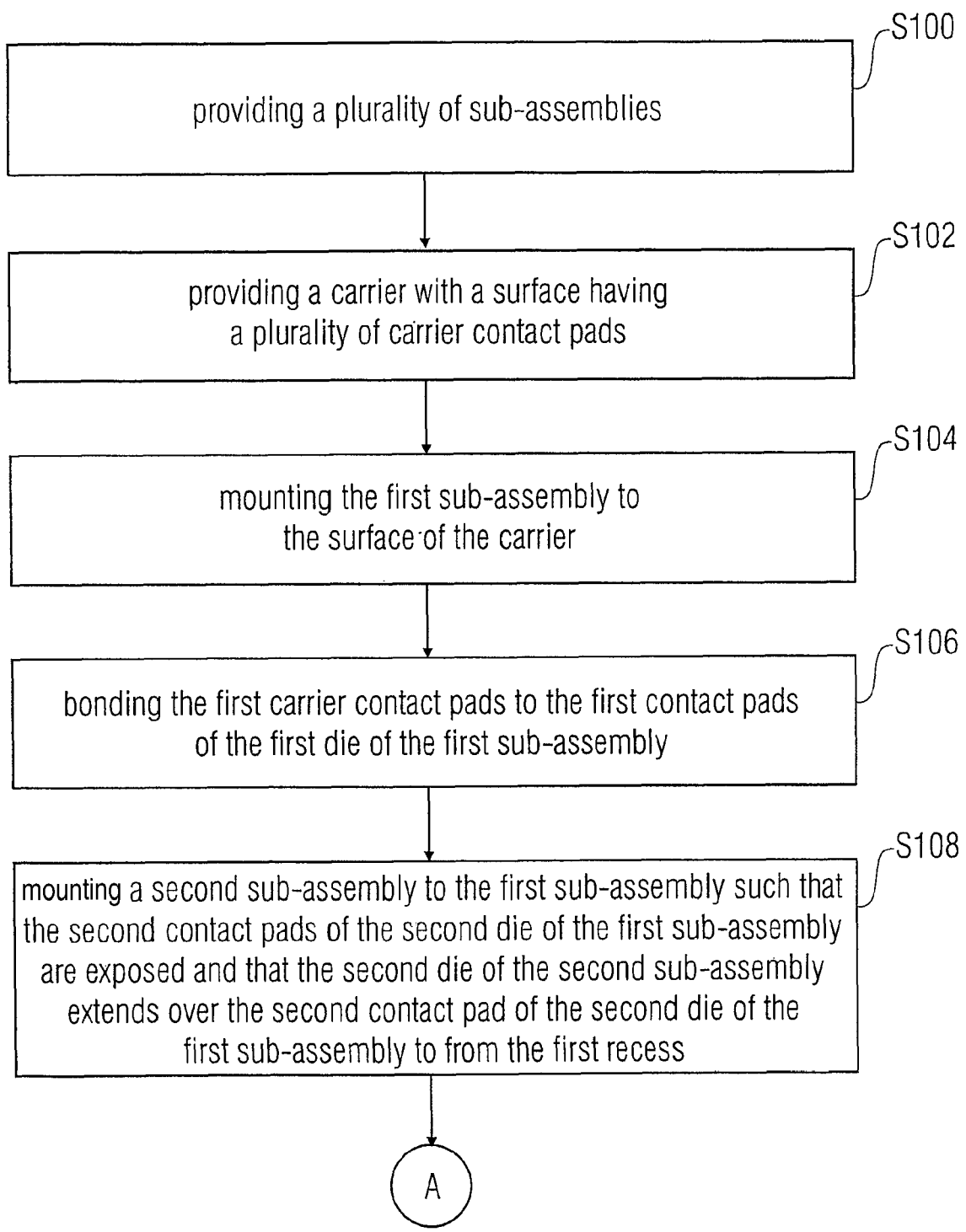

ARRANGEMENT OF STACKED INTEGRATED CIRCUIT DICE HAVING A DIRECT ELECTRICAL CONNECTION

TECHNICAL FIELD

Embodiments of the invention relate to an arrangement of integrated circuit dice and to a method to fabricate same.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1(A) to 1(F) show cross-sectional side views of arrangements of integrated circuit dice according to embodiments;

FIG. 2 shows a cross-sectional side view of an arrangement of integrated circuit dice according to a further embodiment;

FIGS. 3(A) and 3(B) show cross-sectional side views of arrangements of integrated circuit dice according to yet another embodiment;

FIGS. 12(A) and 12(B) show a flow diagram illustrating an embodiment for manufacturing a multi-chip package as described in FIG. 10.

DETAILED DESCRIPTION OF ILLUSTRATIVE EMBODIMENTS

Figure 1D:
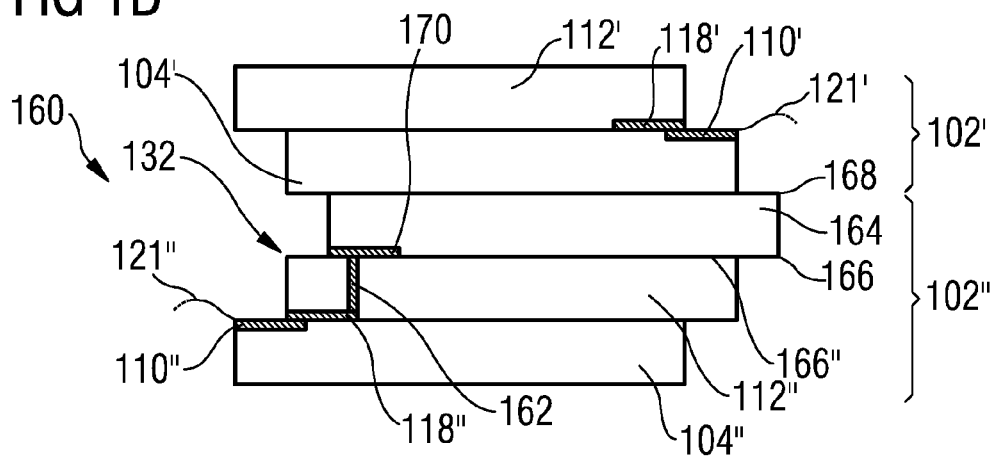

In the field of integrated circuits there may be a need to increase the die density within a single package while maintaining existing standards in terms of package dimensions and package footprint.

Arrangements of integrated circuit dice according to embodiments of the present invention will be described below. The arrangement may comprise a first die comprising a first electrical coupling site, and a second die comprising a second electrical coupling site, wherein the second die is stacked onto the first die such that the first electrical coupling site is at least partially exposed, wherein the first electrical coupling site and the second electrical coupling site are directly electrically connected, and a third die arranged above the first die and the second die such that a recess is formed, wherein one of the first electrical coupling sites is arranged in the recess. In the following description of the embodiments of the present invention the first die and the second die stacked to the first die may be referred to as a stack which comprises the first die and the second die.

Embodiments of the present invention stack dice in a package, i.e., provide a plurality of dice or chips in a single package. In order to increase the amount of silicon die area that may be housed within a single package, dice or chips having a specific functionality may be stacked, i.e., a plurality of chips may be arranged on top of each other. Die stacking is a process of mounting multiple dice or chips on top of each other within a single package. Besides saving area on the substrate, die stacking may also result in better electrical performance of the device, due to the shorter routing of interconnections between circuits which may result in a better signal quality. Such multi-chip packages (also referred to as multi-chip modules) may function as a single chip. The dice may be made of any semiconductor material, such as silicon (Si), gallium arsenide (GaAs), silicon carbide (SiC), or indium phosphide (InP). The dice of such a multi-chip package may have the same functionalities or different functionalities, e.g. one die may be a microcontroller and another die may be a flash memory, a dynamic random access memory (DRAM), a static random access memory (SRAM) or a chip with another functionality. This way of forming a microchip with a certain functionality may be cheaper than a monolithic integration within one (a single) semiconductor die.

FIGS. 1(A) to 1(E) show cross-sectional views of arrangements of integrated circuit dice according to embodiments of the present invention.

FIG. 1(A) shows an arrangement 100 of integrated circuit dice comprising a stack 102. The stack comprises a first die 104 having a first surface 106 (in FIG. 1(A) an upper surface) and a second surface 108 (in FIG. 1(A) a lower surface) opposed to the first surface 106. On the first surface 106 a first electrical coupling site 110, for example a contact pad, is provided. The stack 102 comprises a second die 112 having a first surface 114 (in FIG. 1(A) a lower surface) and a second surface 116 (in FIG. 1(A) an upper surface). On the first surface 114 of the second die 112, a second electrical coupling site 118, for example a contact pad, is formed. The stack 102 further comprises a conductive element 120 which, in the embodiment shown in FIG. 1(A), is provided for a direct electrical connection of the first electrical coupling site 110 of the first die 104 and the second electrical coupling site 118 of the second die 112. As can be seen from FIG. 1(A), the two dice 104 and 112 of stack 102 are arranged in a "flip chip" manner, i.e., the two dice 104 and 112 are stacked on each other in such a manner that their respective first surfaces 106 and 114 face each other and are actually in contact with each other. The first die 104 and the second die 112 are stacked onto each other in such a manner that the same are arranged with an offset x from each other. Thereby the first electrical coupling site 110 of the first die 104 is exposed to allow for an external connection, for example to a carrier or the like. The external connection may for example be provided by a bond wire 121 as is shown in FIG. 1(A).

Onto the stack 102 a further die 122 is arranged. The further die 122 has a first surface 124 (in FIG. 1(A) an upper surface) and a second surface 126 (in FIG. 1(A) a lower surface). A further electrical coupling site 128 is arranged on the first surface 124 of the further die 122. The further die 122 is stacked onto the upper die in the stack 102, i.e., is stacked onto the second die 112, in such a manner that the second surface 116 of the second die 112 and the second surface 126 of the further die 122 are in contact with each other. The further die 122 may also be connected to the carrier supporting the arrangement 100, for example via a further bond wire 130.

In the embodiment shown in FIG. 1(A) the further die 122 is arranged on the stack 102 such that the electrical coupling site 128 of the further die 122 and the electrical coupling site 110 of the first die 104 are arranged on different sides of the arrangement 100, e.g. on opposite sides of the arrangement 100. The further die 122 is stacked onto the stack 102 in such a manner that the first die 104 and the further die 122 are substantially aligned with respect to each other so that a portion 131 of the further die 122 extends above and over the exposed electrical coupling site 110 of the first die 104 thereby defining a recess 132 in which the first electrical coupling site 110 is arranged. The recess 132 is for example also sufficient to accommodate the bond wire 121 which may be attached to the electrical coupling site 110 prior to stacking the further die 122 onto the stack 102. The vertical distance, which is substantially defined by the thickness of the second die 112, is sufficient to provide the further die 122 on the second die 112 without any conflicts regarding the bond wire 121.

FIG. 1(B) shows another embodiment of an arrangement 140 of integrated circuit dice. When compared to FIG. 1(A), the difference between the arrangements 100 and 140 is that in the stack 102 the first chip 104 and the second chip 112 are electrically connected in a different manner. As can be seen, the conductive element 120 used in FIG. 1(A) is omitted, and the second die 112 is mounted onto the first die 104 in such a manner that the electrical coupling sites 110 and 118 provide a direct electrical connection without the need of providing an additional conductive element 120.

FIG. 1(C) describes a further embodiment of an arrangement of integrated circuit dice. In FIG. 1(C), the arrangement 150 is formed by stacking two stacks 102 and 102' above each other. The first stack 102 has a configuration as the stack 102 shown in FIG. 1(B). The second stack 102' is formed in the same manner as stack 102 and is mounted onto the upper die 112 (the second die of the stack 102) such that the first die 104' of the upper stack 102' is in direct contact with the second die 112 of the lower stack 102. In the embodiment shown in FIG. 1(C), the electrical coupling sites 110 and 110' are arranged on the same sides of the arrangement 150. Alternatively, the electrical coupling sites 110 and 110' may be provided on opposite sides of the arrangement 150 as is shown in FIG. 1(F).

FIG. 1(D) shows another embodiment of an arrangement of integrated circuit dice. The arrangement 160 comprises a modified stack 102". The stack 102" comprises a first die 104" and a second die 112" which are electrically connected by overlapping the electrical coupling sites 110" and 118". The second die 112" further comprises a via 162 extending through the die 112" to the second surface 116". The stack 102" comprises a third die 164 having a first surface 166 (in FIG. 1(D) a lower surface) and a second surface 168 (in FIG. 1(D) an upper surface). On the first surface 166 an electrical coupling site 170 is provided. The third die 164 is mounted onto the second die 112" in the "flip chip" manner, i.e., the first surface 166 having the electrical coupling site 170 is mounted to the second surface 116" of the second die 112". The mounting is such that the electrical coupling site 170 of the third die 164 is in electrical contact with the via 162 of the second die 112".

Onto the stack 102", a further stack 102', which was already described with regard to FIG. 1(C), is mounted in such a manner that the first die 104' of the further stack 102' is in contact with the third die 164 and also is aligned with the first die 104" in the stack 102" for defining the recess 132 in which the electrical coupling site 110" of the first die 104" is arranged.

Figure 1E:
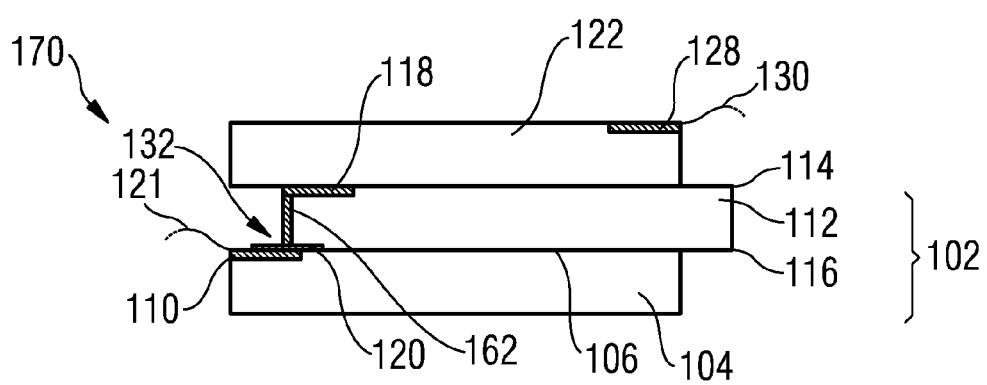
Figure 1F:
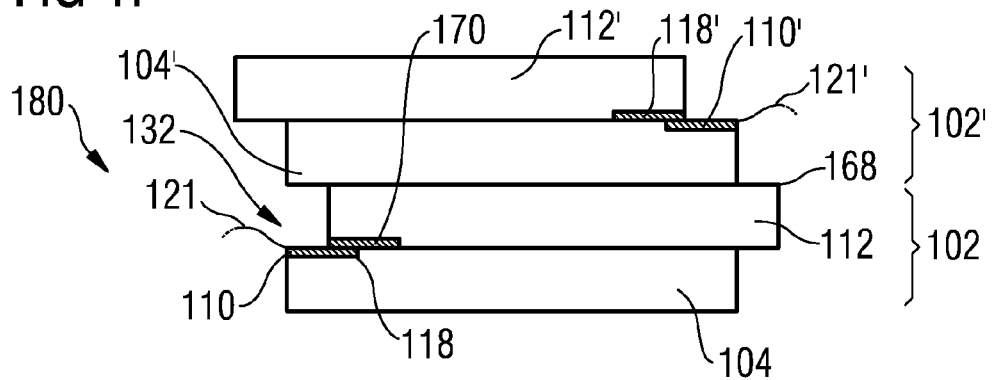

FIG. 1(E) describes yet another embodiment of an arrangement of integrated circuit dice. The arrangement 170 is similar to the arrangement shown in FIG. 1(A), except for a modification of the second die 112 in the stack 102 and for a modification of the arrangement of the second die 112 on the first die 104. In a similar manner as in FIG. 1(D), the second die 112 is provided with a via 162 extending from the electrical coupling site 118 to the second surface 116 (in FIG. 1(E) a lower surface) of the second die 112. Unlike the embodiment of FIG. 1(A), no "flip chip" mounting is used, rather, the dice 104 and 112 are stacked on each other in such a manner that the second surface 116 of the second die 112 is in contact with the first surface 106 (in FIG. 1(E) an upper surface) of the first die 104. The stack 102 further comprises the conductive element 120, for example a conductor, which extends from the first coupling site 110. The conductive element 120 is arranged such that upon mounting the second die 112 onto the first die 104 the via 162 will contact the conductive element 120 thereby providing a direct contact between the two electrical coupling sites 118 and 110.

FIG. 2 shows another embodiment of an arrangement of integrated circuit dice. The arrangement 175 comprises a first stack 102, which corresponds to the stack 102 described above with regard to FIG. 1(A). Further, a second stack 102' having the same configuration as the first stack 102 is provided. The two stacks 102 and 102' are stacked on each other in such a manner that the respective coupling sites 110 and 110' are provided on opposite sides of the arrangement 175. In addition, the first die 104' is mounted to the second die 112 and other than in the embodiments described with respect to FIG. 1, the die 104' is aligned with the second die 112 in the first or lower stack 102. The upper stack 102' is mounted in such a manner that the second die 112' of the upper stack 102' is aligned with the first die 104 in the lower stack 102. A portion 131' of the second die 112' extends above the electrical coupling site 110 of the first die 104 of the lower stack 102 so that the recess 132 accommodating the coupling site 110 and the bond wire 121 is formed. Unlike in the embodiments described with regard to FIG. 1, in the embodiment described with regard to FIG. 2, a plurality of further dice 104' and 112' is mounted to the upper die 112 in the stack 102 for defining the recess 132.

Further embodiments using such a configuration will be described in the following with regard to FIGS. 3, 9, 10 and 11.

FIG. 3(A) shows an embodiment of an arrangement of integrated circuit dice in which the arrangement 180 comprises the stack 102 having the first and second dice 104 and 112, wherein the respective dice have a similar configuration as described with regard to FIGS. 1(A) to 1(C) and FIG. 2. However, unlike in the embodiments described with regard to FIGS. 1(A) to 1(C) and FIG. 2, no "flip chip" mounting of the second die 112 to the first die 104 was used for stacking the two dice on top of each other. Rather, as can be seen from FIG. 3(A), the second die 112 is mounted to the first die 104 with the offset x in such a manner that the second surface 116 of the second die 112 (in FIG. 3(A) a lower surface) is in contact with the first surface 106 (in FIG. 3(A) a lower surface) of the first die 104. In the embodiment shown in FIG. 3(A), a bond wire 120 may be used as the conductive element for providing a direct electrical connection between the electrical coupling site 110 of the first die 104 and the electrical coupling site 118 of the second die 112.

Onto the upper die of the stack 102, i.e. onto the second die 112, a plurality of further dice 104' and 112' is mounted, wherein the plurality of further dice may be provided in the form of a further stack 102'. In the embodiment shown in FIG. 3(A), the further stack 102' has the same configuration as the lower stack 102. As can be seen, the upper stack 102' is mounted onto the lower stack 102 in such a manner that the second surface 108' of the first die 104' of the upper stack 102' is mounted to the first surface 114 (in FIG. 3(A) an upper surface) of the second die 112 in the lower stack 102. Further, the first die 104' is mounted to the second die 112 in such a manner that the electrical coupling site 118 of the second die 112 in the lower stack 102 is exposed. The first die 104' of the upper stack 102' is mounted to the second die 112 of the lower stack 102 with an offset x' which may be the same as the offset x in the first stack 102. Alternatively, the offset x' may be larger or smaller than the offset x in the first stack 102.

In the embodiment shown in FIG. 3(A), the offset x and the offset x' are selected to be substantially the same so that by mounting the upper stack 102, the second die 112' in the second stack will be substantially aligned with the second die 112 in the first stack 102. By the overlapping area 131 the recess 132 is defined, which accommodates the bond wire 120 and the electrical coupling site 118 of the second die 112 of the first stack. As can be seen from FIG. 3(A), the coupling sites 110 and 118 and the coupling sites 110' and 118' are arranged on different sides of the arrangement 180 and may be provided on opposite sides thereof.

FIG. 3(B) shows another embodiment of an arrangement of integrated circuit dice. The arrangement 190 comprises a first stack 102 comprising the first die 104 and the second die 112. The dice have a configuration similar to the dice described with regard to FIG. 3(A), except that the second die 112 comprises a via 162 providing for an electrical connection of the electrical coupling site 118 to the second surface of the second die 112. As can be seen, the dice 104 and 112 are stacked on each other in such a manner that the same are aligned with respect to each other and an electrical connection between the coupling sites 110 and 118 is provided by the via 162. In this embodiment, the bond wire 121 for providing an external connection is connected to the electrical coupling site 118 of the second die 112 in the stack 102. Alternatively, the dice 104 and 112 may be arranged with an offset, as long as the lower end of the via or via hole 162 is in contact with the coupling site 110 on the first die 104.

The arrangement 190 comprises two further stacks 102' and 102'' mounted onto the first stack 102. The configuration of the additional stacks is substantially the same as the one of stack 102. Stack 102' is mounted to the stack 102 in such a manner that the first die 104' of the stack 102' is mounted onto the first surface 114 of the second die 112 of the stack 102. The mounting is such that the first stack 102 and the second stack 102' are mounted to each other with an offset x, thereby at least partially exposing the electrical coupling site 118 of the second die 112 in the first stack 102. In a similar manner, a further stack 102'' is mounted to the second stack 102', again with an offset at least partially exposing the electrical coupling site 118' of the second die 112' in the second stack 102'. The offset between the second and third stacks 102' and 102'' may be the same or may be different from the offset x. Mounting the second stack 102'' in the just-mentioned manner forms the recess 132 in which the electrical coupling site 118 of the second die 112 in the first stack 102 is accommodated. In the embodiment shown in FIG. 3(B), the first stack 102 and the further stack 102'' are aligned with each other. The respective external coupling sites 118 and 118'' are provided on the same side of the arrangement 190, whereas the electrical coupling site 118' of the second stack 102' is arranged on a different side of the stack 190.

Examples for the above stacks 102 comprising at least the first die and the second die will be described in the following, wherein such a stack will be referred to as a "sub-assembly," which is used for manufacturing the arrangement of integrated circuit devices according to embodiments of the present invention. Such a sub-assembly is formed by applying a first die-attach step to provide the second die on the first die and a first die-bonding step to provide a bond wire between the contact pads of the two dice. This may require one passage through a die-bonder equipment and one passage through a wire-bonder equipment. Thus, the die to die wire bonding may be done without adding additional steps to the process. Embodiments may assemble two or more of these sub-assemblies into the arrangement of an integrated circuit (also referred to as multi chip device) described above and in the following in FIGS. 9 to 11. If N is the number of the dice, the number of operations in the production needed may only be (N/4)+1, wherein one operation is defined by die-attaching and wire-bonding. In addition, the wire population at the board level, i.e., the number of wire connections to the dice of the multi chip device originating from a singe pad, is reduced to N/2 wires or connections.

Figure 4:
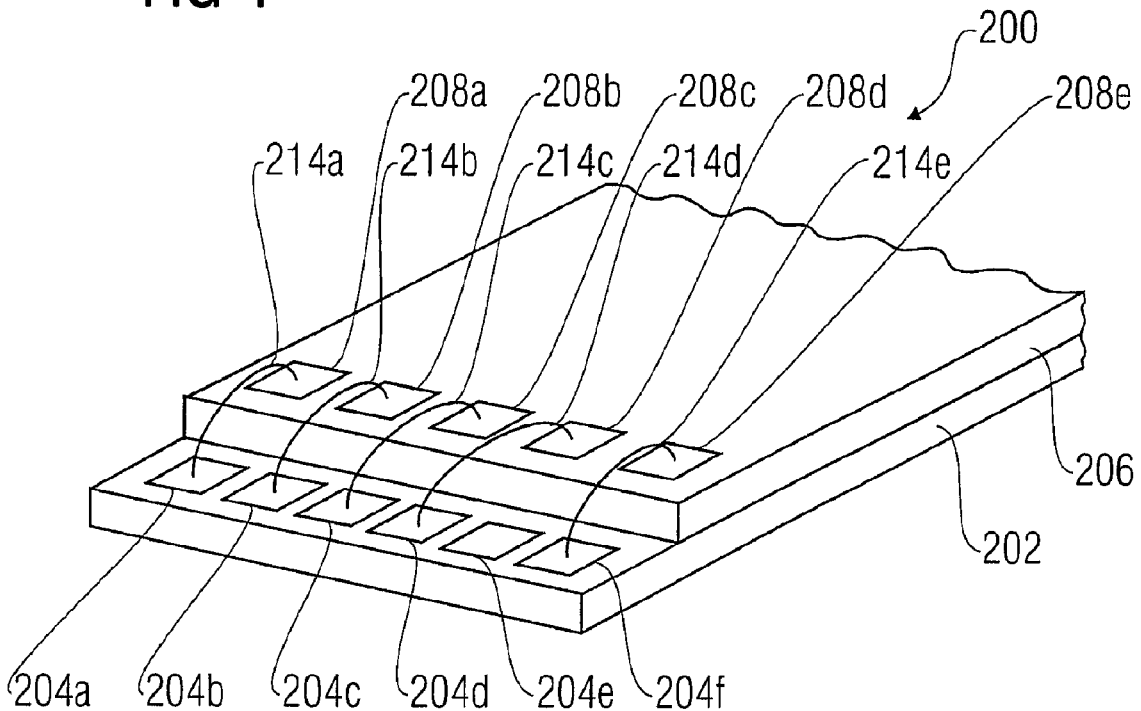
FIG. 4 shows a perspective view of an example of a stack (sub-assembly) of integrated circuit dice used in the arrangement described in FIG. 3(A)

FIG. 4 shows a perspective view of a stack of dice (sub-assembly) 200 which comprises a first die 202 comprising a plurality of first contact pads 204a to 204f arranged at a periphery of the first die 202, and a second die 206 comprising a plurality of second contact pads 208a to 208e arranged at the periphery of the second die 206. The second die 206 is arranged on the first die 202 with an offset so that the first contact pads 204a to 204f of the first die 202 are exposed. A plurality of bond wires 214a to 214e are provided for connecting the first contact pads 204a, 204b, 204c, 204d and 204f to the second contact pads 208a, 208b, 208c, 208d and 208e. The first contact pads 204a to 204e and the second contact pads 208a to 208e may be connected to an internal circuit inside the respective die 202, 206, while the contact pad 204f on the first die 202 may be a dummy pad which has no connection to the internal circuit of the first die 202. The dummy pad 204f may be used to provide a signal only to the second die 206 without applying the same to the first die 202. An example of such a signal may be a chip select signal (CE) as used in memory devices which is provided to activate only a desired memory die for operation without activating other dice.

Figure 5A:
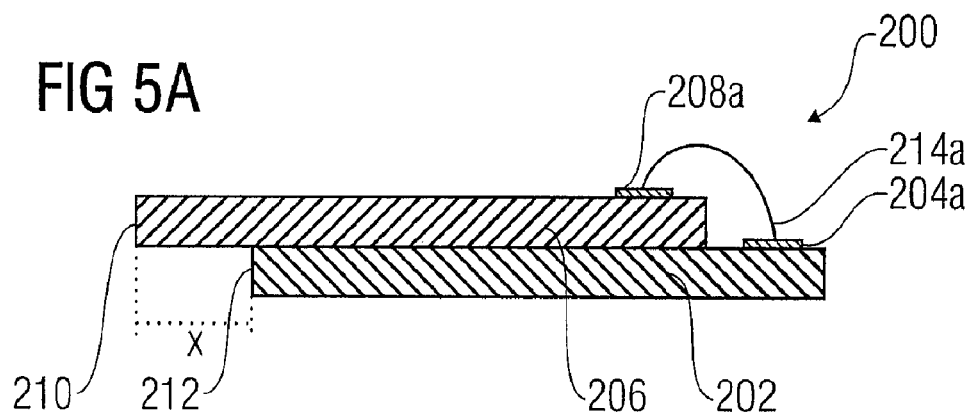
FIG. 5(A) shows a cross-sectional side view of the stack of integrated circuit dice of FIG. 4.
Figure 5B:
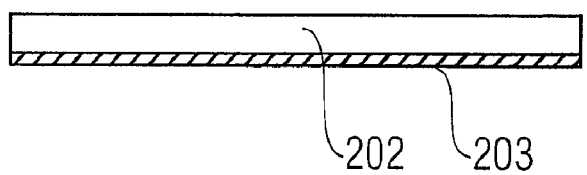
FIG. 5(B) shows a cross-sectional side view of a die with a film attach.

FIG. 5(A) shows a cross-sectional side view of the sub-assembly of FIG. 4. As can be seen one end 210 of the second die 206 extends beyond the end 212 of the first die 202 by a distance x. FIG. 5(B) shows a die 202 with a die-attach film 203 at the bottom of the die 202 which may be used as a basic element for forming the above described sub-assembly. A possible approach may be to apply the die-attach film 203 to the whole wafer. After singulation of the dice, all the single dice will have one surface with the die-attach material applied. At this time it is possible to do the first die attach. After that first die attach, two dice are stacked and wire bonded yielding the sub-assembly.

Figure 6:
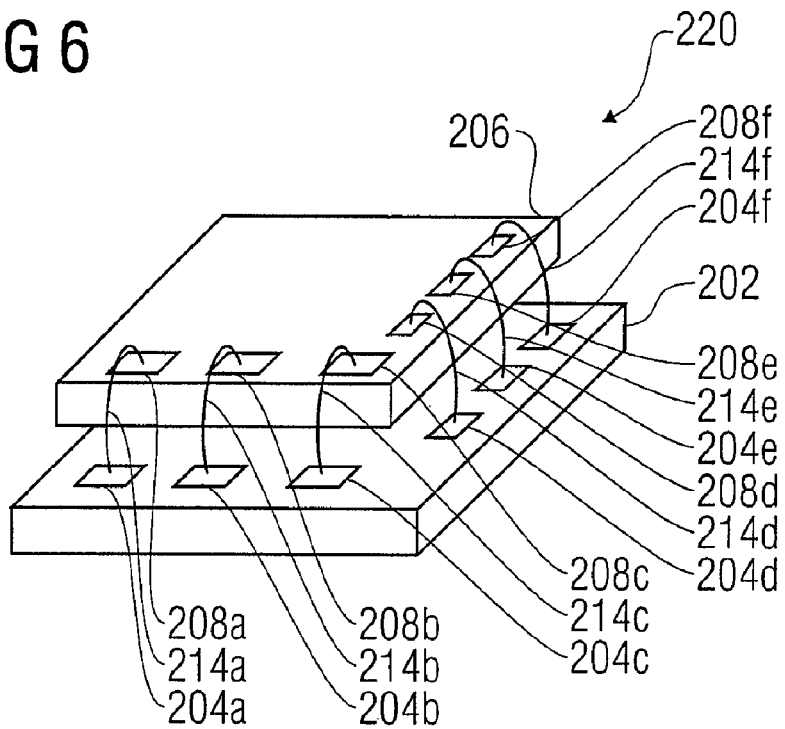
FIG. 6 shows a perspective view of another example of a stack of integrated circuit dice.

FIG. 6 shows a perspective view of another sub-assembly 220. In FIG. 6 elements already described in FIG. 4 are denoted with the same reference signs. When compared to the sub-assembly of FIG. 4 the contact pads 204 and 208 are arranged at different parts of the periphery of the respective die. In addition, all pads are connected to the respective internal circuit, i.e. no dummy pad is provided.

The dice 202 and 206 may comprise the same integrated circuits or may comprise different integrated circuits. The integrated circuit may be selected from a logic circuit, a memory circuit, and/or a signal processing circuit. The memory circuit may for example be an SRAM memory, a flash memory, a DRAM, a phase change RAM (PCRAM), a RAM, a ROM, or an EEPROM. Each of the contact pads may forward an electrical signal, e.g., command, address or data signals.

The first die and the second die may have the same shape or different shapes, wherein the shape may for example be a square shape, a rectangular shape, a triangular shape, a polygonal shape, a circular shape, and/or an elliptical shape.

Figure 7A:
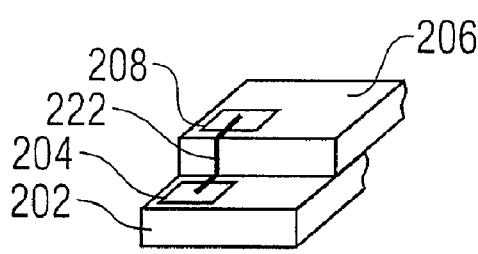
FIGS. 7(A) to 7(D) show examples of conductive elements for connecting electrical coupling sites (e.g., contact pads) of two or more dice.
Figure 7B:
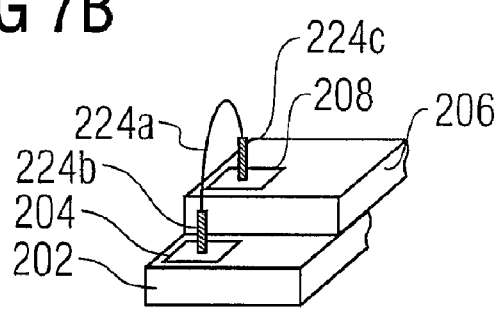
Figure 7C:
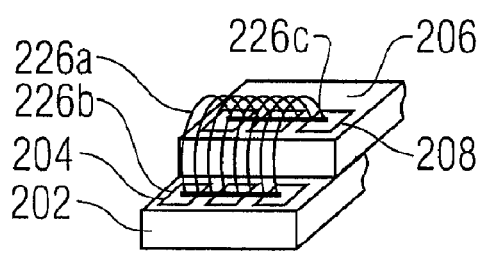
Figure 7D:
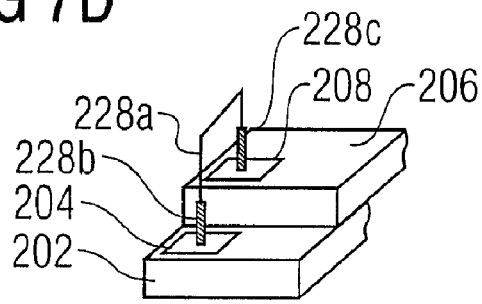

Conductive elements other than a bond wire may be used, e.g., a conductor 222 (see FIG. 7(A)), a cable 224a with respective connectors 224b, 224c for connection to respective connectors forming the pads 204, 208 (see FIG. 7(B)), a ribbon cable 226a having connectors 226b, 226c spanning a plurality of pads 204, 208 comprising respective connectors (see FIG. 7(C)), a wire wrap connection comprising a wire 228a wrapped around respective posts 228b, 228c formed on the pads 204, 208 (see FIG. 7(D)), or combinations thereof. Also coated wires may be used.

Figure 8:
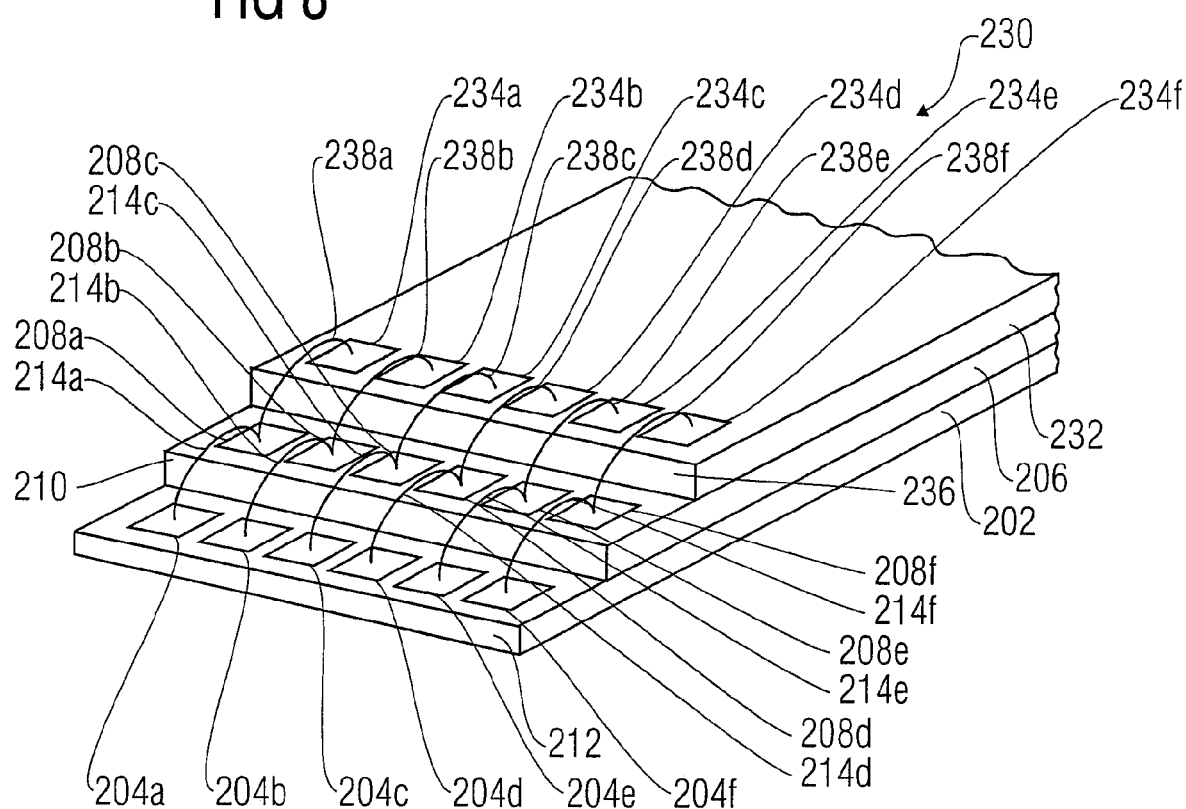
FIG. 8 shows a perspective view of yet another example of a stack of integrated circuit dice.

FIG. 8 shows a perspective view of yet another example of a sub-assembly 230. Elements already described in FIG. 4 are denoted with the same reference signs. When compared to the sub-assembly of FIG. 4, sub-assembly 203 comprises a third die 232 comprising a plurality of third contact pads 234a to 234f arranged at the periphery of the third die 232. The third die 232 is arranged on the second die 206 such that the second contact pads 208a to 208f of the second die 206 are exposed. A plurality of bond wires 238a to 238f are provided for connecting the second contact pads 208a to 208f to the third contacts pads 234a to 234f. In FIG. 8 no dummy pad is provided.

In the following, further embodiments will be described in which the above described sub-assemblies may be assembled to the arrangement of an integrated circuit die (also referred to as a multi chip device).

Figure 9:
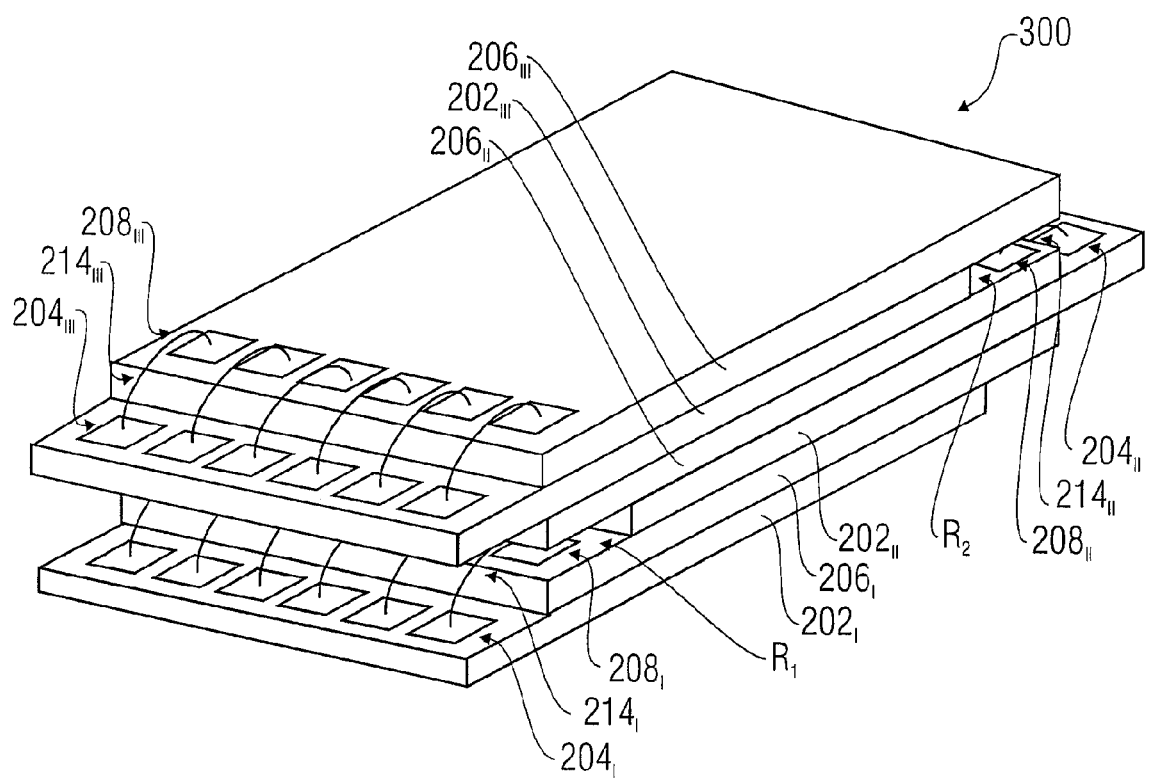
FIG. 9 shows a schematic perspective view of an arrangement of integrated circuit dice according to yet another embodiment.

FIG. 9 shows a schematic perspective view of an arrangement of an integrated circuit die (multi chip device) 300 according to an embodiment of the present invention. The multi chip device 300 comprises sub-assemblies as described in detail in FIG. 4 but without a dummy pad. A first sub-assembly I and a second sub-assembly II are stacked such that the contact pads $208_I$ of the second die $206_I$ of the first sub-assembly I are exposed. Further, the second die $206_{II}$ of the second sub-assembly II extends over the contact pads $208_I$ of the second die $206_I$ of the first sub-assembly I thereby forming a first recess $R_1$ (similar to the recess 132 in FIG. 3(A)) accommodating the contact pads $208_I$ bonded to the contact pads $204_I$. A further sub-assembly III is stacked onto the second sub-assembly II in the same manner as the second sub-assembly II is stacked on the first sub-assembly I. In a similar manner, a second recess $R_2$ accommodating the contact pads $208_{II}$ bonded to the contact pads $204_{II}$ is formed.

Figure 10:
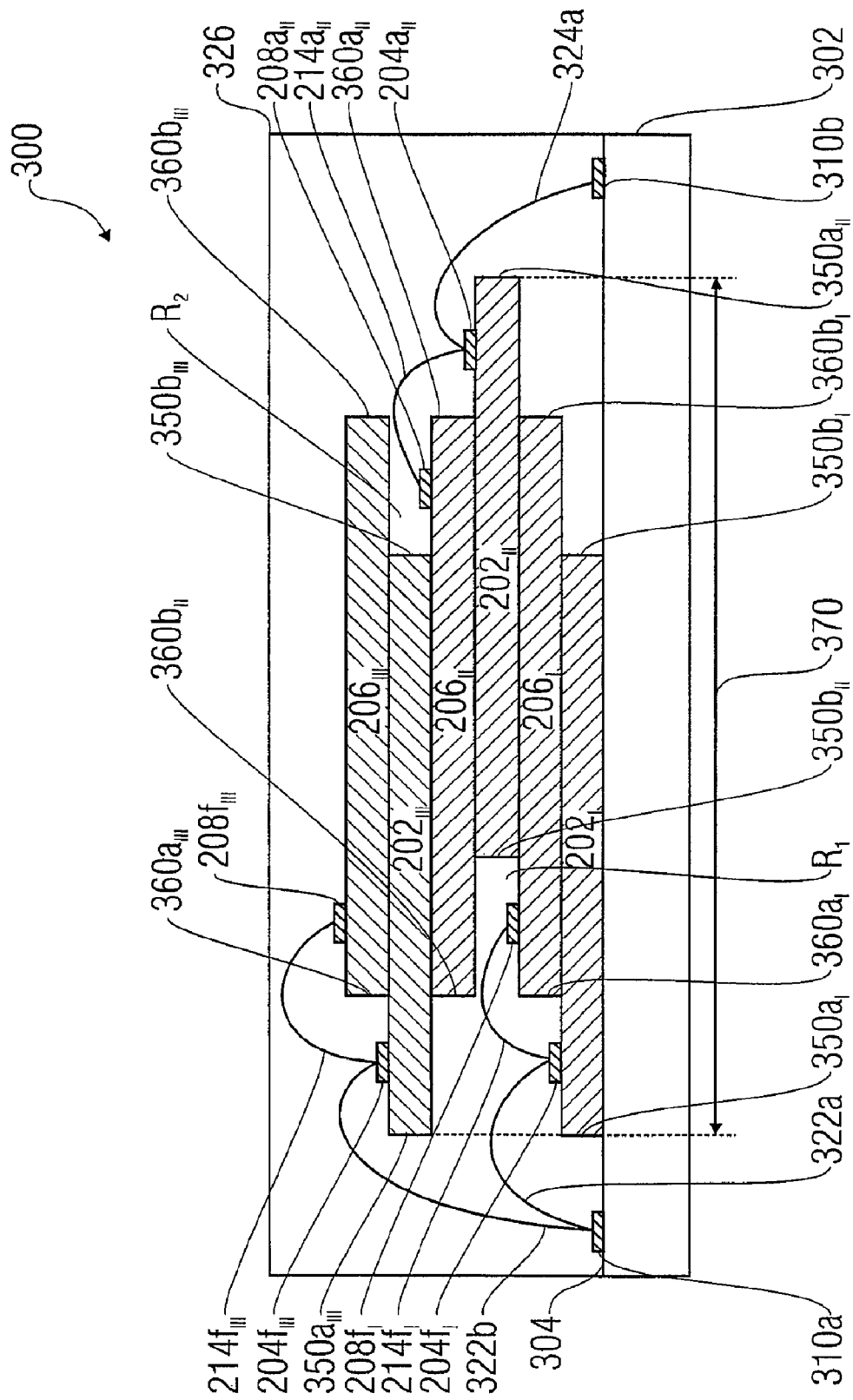
FIG. 10 shows a cross-sectional side view of a multi-chip package comprising the arrangement of integrated circuit dice of FIG. 9 arranged on a carrier.

FIG. 10 shows a cross-sectional side view of the multi chip device 300 of FIG. 9 arranged on a carrier 302 on which carrier contact pads 310a and 310b are provided. Bond wires 322a and 322b connect the carrier pad 310a to the contact pad $204f_I$ of the first die $202_I$ of the first sub-assembly I and to the contact pad $204f_{III}$ of the first die $202_{III}$ of the third sub-assembly III. A bond wire 324a connects the carrier pad 310b to the contact pad $204a_{II}$ of the first die $202_{II}$ of the second sub-assembly II. The sub-assemblies I, II, and III are stacked such that the contact pads $208_I$, $208_{II}$, and $208_{III}$ of the respective second dice $206_I$, $206_{II}$, and $206_{III}$ of the sub-assemblies I, II, and III are exposed and such that the recesses $R_1$ and $R_2$ are formed. The first dice $202_I$ and $202_{II}$ and the second dice $206_I$ and $206_{III}$ of the first and third sub-assemblies I and III are substantially aligned with each other (see the boundaries indicated by reference signs $350a_I$, $350a_{III}$, $360a_I$, $360a_{III}$, $350b_I$, $350b_{III}$, $360b_I$, and $360b_{III}$). Also the second dice $206_I$ and $206_{III}$ of the first and third sub-assemblies I and III are substantially aligned with the second die $206_{II}$ of the second sub-assembly II (see the boundaries indicated by reference signs $360a_I$, $360a_{II}$, $360a_{III}$ and $360b_{II}$). To obtain the recesses $R_1$, $R_2$, the sub-assemblies I, II, and III are stagger-stacked. Also, this may reduce the footprint 370. On the upper surface 304 of the carrier 302 a housing 326 may be arranged enclosing the stack, the plurality of carrier contacts 310a and 310b and the plurality of bond wires 322a to 322d and 324a to 324b to form a multi-chip package. The housing may be formed of a metal or plastic casing, may be a resin encapsulating the elements or may be a molded housing.

Figure 11:
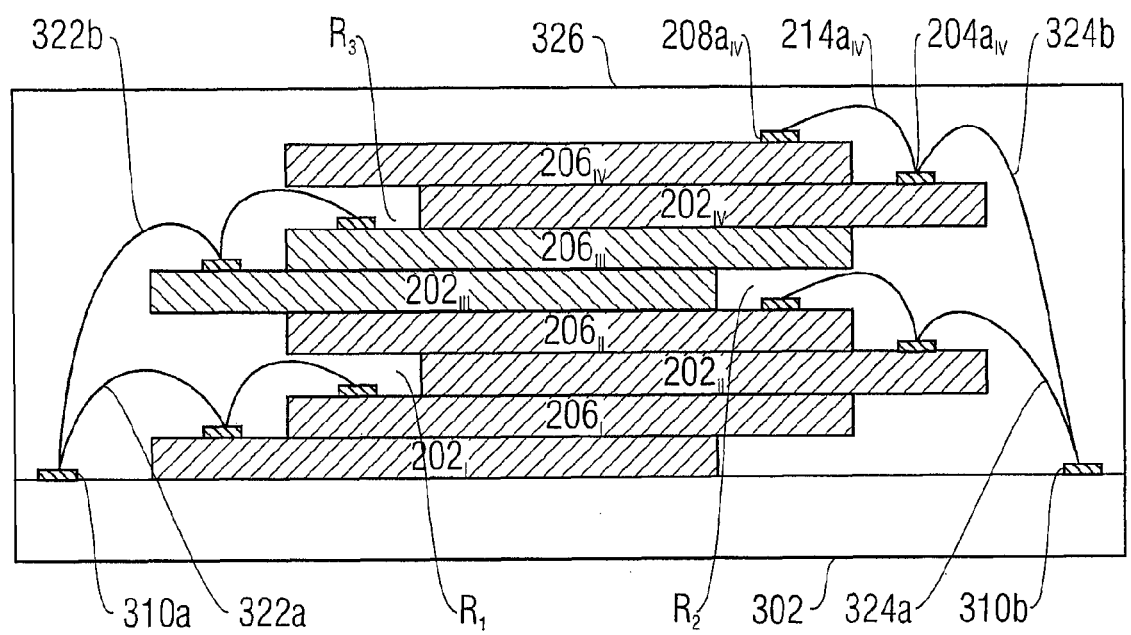
FIG. 11 shows a cross-sectional side view of another multi-chip package comprising an arrangement of integrated circuit dice according to another embodiment of the invention and arranged on a carrier.

FIG. 11 shows a cross-sectional side view of a multi-chip package comprising a multi chip device similar to the one shown in FIG. 10 except that a fourth sub-assembly IV is stacked onto the third sub-assembly III whose contact pad $240a_{IV}$ is connected via a bond wire 324b to the carrier pad 310b. The fourth sub-assembly IV is stacked onto the third sub-assembly III in the same manner as the second sub-assembly II is stacked onto the first sub-assembly I. Thereby, a third recess $R_3$ is formed for accommodating the contact pads $208_{III}$ bonded to the contact pads $204_{III}$.

Figure 12B:
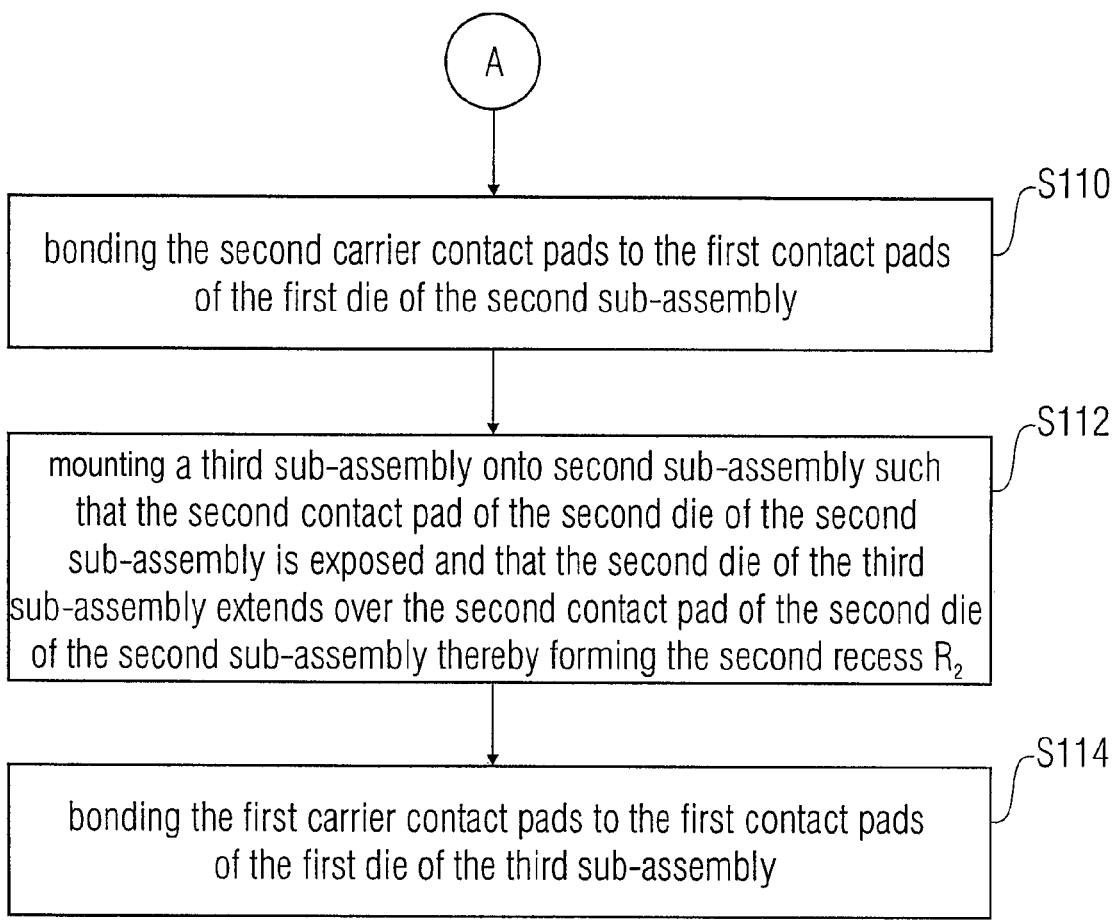

FIGS. 12A and 12B show a flow diagram illustrating an embodiment for manufacturing a multi-chip package as described in FIG. 9. Sub-assemblies as described in FIG. 4 or FIG. 6 may be used (with or without dummy pad(s)).

In a step S1100 a plurality of sub-assemblies I, II and III is provided. In a step S 102 a carrier 302 is provided with a surface comprising the plurality of carrier contact pads 310a, 310b. To the surface of the carrier 302, the first sub-assembly I is mounted in step S104. Then the first carrier contact pads 310a are electrically connected to the first contact pads $204_I$ of the first die $202_I$ of the first sub-assembly I by bond wires (see step S106). Onto this structure a second sub-assembly II is stacked by mounting the same in step S108 onto the first sub-assembly I. The second sub-assembly II is mounted such that the second contact pads $208_I$ of the second die $206_I$ of the first sub-assembly I are exposed and the second die $206_{II}$ of the second sub-assembly II extends over the second contact pad $204_I$ of the second die $208_I$ of the first sub-assembly I to form the recess $R_1$. The second carrier contact pads 310b are electrically connected to the first contact pads $204_{II}$ of the first die $202_{II}$ of the second sub-assembly II by bond wires as shown in step S110.

A third sub-assembly III is stacked in step S112 onto the second sub-assembly II. The third sub-assembly II is mounted such that the second contact pad $208_{II}$ of the second die $206_{II}$ of the second sub-assembly II is exposed and the second die $206_{III}$ of the third sub-assembly III extends over the second contact pad $208_{II}$ of the second die $206_{II}$ of the second sub-assembly II thereby forming the second recess $R_2$. In step S114 the first carrier contact pads 310a and the first contact pads $204_{III}$ of the first die $202_{III}$ of the third sub-assembly III are electrically connected by bond wires.

While embodiments of the invention were described in which all contact pads were electrically connected, it is noted that the invention is not limited to such an arrangement. Rather, dependent on the dice (and the internal circuits thereof) not all pads may be connected. Also the number of dice to be stacked in the described sub-assemblies and multi chip devices is not limited to the number shown. Rather any desired number of dice may be stacked to form a sub-assembly. Likewise, the number of sub-assemblies to be stacked in the described multi chip device is not limited to the number shown. Rather any desired number of sub-assemblies may be stacked. Embodiments of the invention may provide multi chip devices comprising 8, 16 or more dice.

Embodiments of the invention concern a system comprising one or more of the multi chip devices. Such a system may be a logic system, a memory system, a signal processing system, and combinations thereof.

The carrier in the multi chip device may be a circuit board, a printed circuit board, a semiconductor substrate, or the like.

In the above description of embodiments of the arrangements of integrated circuit dice the further die/dice were described as being arranged on the upper die in a stack of dice formed by the first die and the second die. In general, the further die/dice may be arranged above the first die and the second die with one or more additional layers, e.g., one or more spacer layers of an insulating material therebetween. Also embodiments were described in which a die was mounted on a carrier. In general, the die may be mounted above the carrier with one or more additional layers, e.g., one or more spacer layers of an insulating material between the carrier and the die.

What is claimed is:

1. An arrangement of integrated circuit dice, the arrangement comprising:
    a first die comprising at least a first electrical coupling site;
    a second die comprising at least a second electrical coupling site, wherein the second die is arranged on top of the first die such that a first stack is formed, wherein the second die is laterally offset from the first die such that the first electrical coupling site is at least partially exposed, and wherein the first electrical coupling site and the second electrical coupling site are directly electrically connected, and wherein the first stack is arranged such that the first electrical coupling site and the second electrical coupling site partially overlap; and
    a third die arranged above the first stack, on an upper die in the first stack such that a recess is formed, wherein the first electrical coupling site is arranged in the recess.

2. The arrangement of claim 1, wherein a plurality of further dice is arranged on an upper die of the first stack.

3. The arrangement of claim 1, wherein the first die comprises a first surface and a second surface, wherein the first electrical coupling site is arranged on the first surface of the first die, wherein the second die comprises a first surface and a second surface, wherein the second electrical coupling site is arranged on the first surface of the second die, and wherein the first surface of the first die and the first surface of the second die face each other.

4. The arrangement of claim 1, wherein the third die comprises a third electrical coupling site, and wherein the arrangement further comprises:
    a fourth die directly electrically connected to the third die and comprising a fourth electrical coupling site, the fourth die is arranged on top of the third die such that a second stack is formed, wherein the fourth die is laterally offset from the third die such that the third electrical coupling site is at least partially exposed.

5. The arrangement of claim 4, wherein the first and second electrical coupling sites and the third and fourth electrical coupling sites are arranged on a same side of the arrangement.

6. The arrangement of claim 1, wherein the first stack comprises at least one further die.

7. The arrangement of claim 1, further comprising a plurality of first electrical coupling sites and a plurality of second electrical coupling sites.

8. The arrangement of claim 1, wherein the first die comprises a first surface and a second surface, wherein the first electrical coupling site is arranged on the first surface of the first die, wherein the second die comprises a first surface and a second surface, wherein the second electrical coupling site is arranged on the first surface of the second die, and wherein the first surface of the first die and the second surface of the second die face each other.

9. The arrangement of claim 2, wherein the first stack comprises at least one further die.

10. An apparatus comprising:
    a first integrated circuit die comprising first means for electrically coupling an integrated circuit of the first die, and a second integrated circuit die comprising second means for electrically coupling an integrated circuit of the second die, wherein the second integrated circuit die is stacked onto the first integrated circuit die, wherein the second integrated circuit die is laterally offset from the first integrated circuit die such that one of the means for electrically coupling is at least partially exposed, wherein the first means for electrically coupling and the second means for electrically coupling are directly electrically connected; and
    one or more further integrated circuit dice arranged above the first integrated circuit die and the second integrated circuit die such that a recess is formed, wherein one of the means for electrically coupling is arranged in the recess.

11. The arrangement of claim 4, wherein the first and second electrical coupling sites and the third and fourth electrical coupling sites are arranged on different sides of the arrangement.

12. The arrangement of claim 1, wherein the third die comprises a third electrical coupling site, and wherein the arrangement further comprises:
    a fourth die electrically connected to the third die and comprising a fourth electrical coupling site, the fourth die is arranged on top of the third die such that a second stack is formed, wherein the fourth die is laterally offset from the third die such that the fourth electrical coupling site is at least partially exposed.

* * * * *